United States Patent
Aono et al.

(10) Patent No.: US 9,058,061 B2
(45) Date of Patent: Jun. 16, 2015

(54) MOBILE TERMINAL

(75) Inventors: Tomotake Aono, Yokohama (JP); Tetsuya Takenaka, Yokohama (JP)

(73) Assignee: Kyocera Corporation, Kyoto (JP)

( * ) Notice: Subject to any disclaimer, the term of this patent is extended or adjusted under 35 U.S.C. 154(b) by 805 days.

(21) Appl. No.: 12/672,879

(22) PCT Filed: Aug. 8, 2008

(86) PCT No.: PCT/JP2008/064325
§ 371 (c)(1),
(2), (4) Date: May 26, 2010

(87) PCT Pub. No.: WO2009/022657
PCT Pub. Date: Feb. 19, 2009

(65) Prior Publication Data
US 2011/0095986 A1    Apr. 28, 2011

(30) Foreign Application Priority Data

Aug. 10, 2007 (JP) .................................. 2007-210255
May 29, 2008 (JP) .................................. 2008-140939

(51) Int. Cl.
G06F 3/02        (2006.01)
G06F 3/023       (2006.01)
H03M 11/10       (2006.01)

(52) U.S. Cl.
CPC .... G06F 3/0233 (2013.01); *H03K 2217/94036* (2013.01); H03M 11/10 (2013.01); *H04M 2250/22* (2013.01); *H04M 2250/70* (2013.01); G06F 3/0236 (2013.01); G06F 3/0237 (2013.01)

(58) Field of Classification Search
USPC ............... 345/157, 168; 455/572, 552.1, 574; 368/157
See application file for complete search history.

(56) References Cited

U.S. PATENT DOCUMENTS

| | | | | |
|---|---|---|---|---|
| 5,636,325 | A | * | 6/1997 | Farrett .......................... 704/258 |
| 2005/0114138 | A1 | * | 5/2005 | Tomishige et al. ........... 704/260 |
| 2011/0169731 | A1 | * | 7/2011 | Takenaka et al. ............. 345/157 |

FOREIGN PATENT DOCUMENTS

| JP | SHO63-080631 | 5/1988 |
|---|---|---|
| JP | 09-319518 | 12/1997 |

(Continued)

OTHER PUBLICATIONS

Office Action for Chinese Patent Application No. 200880102514.0, issued Apr. 28, 2012, 11 pages (including English translation).

(Continued)

*Primary Examiner* — Shaheda Abdin
(74) *Attorney, Agent, or Firm* — Duane Morris LLP

(57) ABSTRACT

A touch panel 1 is arranged on the front face of a key display unit 2 and accepts an input to a numeric keypad displayed on the key display unit 2. When a key of the numeric keypad displayed on the key display unit 2 is pressed, the control unit 4 measures the time for which the key is kept pressed long with a timer 5 and updates characters assigned to the key one by one by regarding that the key is pressed once each time a predetermined period of time passes while the key is kept pressed long, and then displays each character on the display unit 3. Further, the control unit 4 notifies a vibration unit 6 of the timing of updating the character each time the predetermined time passes while the key is kept pressed long. The vibration unit 6 vibrates the touch panel 1 based on the timing of updating the character notified by the control unit 4. Thus a mobile terminal that enables a user to input a desired character without watching the mobile terminal is provided.

12 Claims, 10 Drawing Sheets

(56) References Cited

FOREIGN PATENT DOCUMENTS

| JP | 2001-177638 | | | 6/2001 | |
|---|---|---|---|---|---|
| JP | 2002-149312 | | | 5/2002 | |
| JP | 2003-264620 | | | 9/2003 | |
| JP | 2005-173966 | | | 6/2005 | |
| JP | 2005173966 | A | * | 6/2005 | ............ G06F 3/023 |
| JP | 2006-221568 | | | 8/2006 | |
| WO | WO-02/091160 | A1 | | 11/2002 | |
| WO | WO-2007/016704 | A2 | | 2/2007 | |

OTHER PUBLICATIONS

Office Action from Korean Patent Application No. 10-2010-7002960, mailed on Jun. 21, 2011.
Notice of Reasons for Refusal for Japanese Patent Application No. 528,116/2009, 4 pages, mailed Jan. 10, 2012 (including English translation).
International Search Report for PCT/JP2008/064325, mailed on Sep. 22, 2008, 2 pages.
Office Action dated Feb. 26, 2013, issued in corresponding Japanese Patent Application No. 2012-04971.
Office Action dated Feb. 26, 2013, issued in corresponding Chinese Patent Application No. 200880102514.0.
JP2012-130140 Office Action mailed Jan. 22, 2013.
Office Action dated Sep. 3, 2013 in corresponding Chinese Patent Application No. 200880102514.0 (submitted with a concise explanation), 6 total pages.
Office Action dated Jul. 30, 2013 in corresponding Japanese Patent Application No. 2012-130140 (Statement of Relevance included), 2 total pages.
Extended European Search Report dated May 15, 2014 from corresponding European Patent Application No. 08827312.3, 7 pages.

\* cited by examiner

MOBILE TERMINAL

CROSS REFERENCE TO RELATED APPLICATIONS

This application is a U.S. National Phase of International Application No. PCT/JP2008/064325 (filed on Aug. 8, 2008), which claims priority to and the benefit of Japanese Patent Application Nos. 2007-210255 (filed on Aug. 10, 2007) and 2008-140939 (filed on May 29, 2008), the whole contents of which are incorporated herein by reference.

TECHNICAL FIELD

The present invention relates to a mobile terminal.

BACKGROUND ART

As for a mobile terminal that is not provided with a full keyboard such as a cell phone, a user generally uses a numeric keypad to input characters. For example, each row of Japanese is assigned to each key of numeric keyboard, such as row A to '1', row KA to '2', row SA to '3' and row WA to '0'. The mobile terminal enables the user to input a desired character by displaying characters of each row in order (such as A→I→U→E→O→small A→small I→small U→small E→small O, KA→KI→KU→KE→KO, and the like) depending on the number of presses of each key. In the same manner, the mobile terminal enables the user to input the English alphabet by assigning characters to each key of the numeric keypad, such as a, b and c to '2', d, e and f to '3', g, h and i to '4', and w, x, y and z to '9'. In addition, when the user keeps pressing each key for more than a predetermined period (long press), the characters assigned to the key are displayed in order as described above every predetermined period during long press of the key. Then by releasing the key (removes the long press) while the target character is displayed, the user can input the target character.

The same character input method is also applied to a mobile terminal provided with a touch panel as an input apparatus. In a numeric keypad displayed on a display screen, characters are assigned to a key displayed corresponding to an input position on the touch panel, and the characters assigned to the key are displayed in order depending on the number of inputs (presses) or duration of the long press to the input position (key). Thus, the input character can be determined by determination operation by the user.

In the case where a numeric keypad is configured by mechanical keys or buttons and the like (hard keys), when the method in which one of characters assigned to the key is determined depending on the number of presses is used, the user can perceive the target key based on the boundary or existence of convex and concave of keys by touching the keypad. Thus the user can input characters without watching the mobile terminal.

However, in the case of a touch panel, it is difficult to perceive the target input position (key) by touching. Therefore the user needs to determine the key position by watching it. Further, when the method in which the character assigned to the key is determined depending on the number of presses is used, in order to search the target character, the user needs to press the target key with watching it so that the characters assigned to the key are displayed one by one. Thus the user cannot input to the mobile terminal while doing other things that disturb the user in watching the mobile terminal, such as tapping keys for an e-mail while watching TV.

In order to avoid such inconvenience of input to a touch panel, an information input/display apparatus in which a touch panel is overlapped with a cover and convex and concave of the cover is changed has been suggested (see patent document 1). According to this patent document, the target position on a touch panel can be perceived by touching it.

Patent Document 1: Japanese Patent Application Laid-Open No. 9-319518

SUMMARY OF INVENTION

Technical Problems

However, in the case of a touch panel, unlike a hard key, "a feeling of click" cannot be obtained when tapping keys. Therefore, even if the user can determine the target position on the touch panel by touching it, he/she cannot determine whether or not the input to the target position is effectively accepted as he/she intends. In other words, as for the method in which the target character is determined from among the characters assigned to the key depending on the number of presses, when the user believes that he/she has inputted "KI" (or "b") by pressing the key twice, but unconsciously touched the touch panel longer because he/she cannot obtain a feeling of click, the mobile terminal may recognize that the key is pressed three times and display "KU" (or "c"). Thus input error occurs.

On the other hand, according to the method in which the target character is inputted by pressing the key long, once the user is able to determine the target key position, all that is left for him/her is to keep pressing the key. Therefore, the problem of input error caused by obtaining no feeling of click is solved. However, in this case, the user needs to watch a display screen because he/she determines the target character from among the characters displayed in order on the display screen depending on the duration of the long press.

The present invention has been made in view of the above problems, and it is an object of the present invention to provide a mobile terminal that enables a user to input desired characters without watching the mobile terminal.

Solutions to Problems

In order to achieve the above object, a mobile terminal in accordance with the present invention includes: an input unit for accepting an input by a user; a display unit for, while a key of the input unit is pressed long, displaying a plurality of characters assigned to the key in order by updating display every predetermined period of time; and an informing unit for informing that the input is accepted in response to the input to the input unit, and while the key of the input unit is pressed long, informing a timing of updating display of the character assigned to the key.

Further, it is preferable that the mobile terminal in accordance with the present invention further includes: a memory unit for storing candidate character strings that can be conversion candidates of predictive conversion inputs; a conversion candidate indication unit for indicating, among the candidate character strings stored in the memory unit, a candidate character string corresponding to an input character string by the user; and a control unit for determining, at a timing of switching display of a character by long press of a key, whether or not the candidate character string corresponding to the input character string including a character after switching is stored in the memory unit and for controlling an informing mode of the informing unit based on the determination result.

In addition, it is preferable that the input unit is configured by a key display unit for displaying a plurality of keys and a touch panel arranged in association with the key display unit.

Further, it is preferable that the informing unit informs that the input to the input unit is accepted and the update timing by vibrating the input unit and, when accepting the input to the input unit or at the update timing, controls strength of the vibration depending on whether or not the candidate character string corresponding to a character string including a character assigned to the key displayed on the display unit is stored in the memory unit.

Moreover, it is preferable that the mobile terminal in accordance with the present invention further includes a control unit for controlling the informing unit, when input to the input unit is moved from one key to another, to inform that the input to the another key is accepted differently than when informing that the input to the one key is accepted.

Further, it is preferable that the mobile terminal in accordance with the present invention further includes a control unit for controlling the informing unit, when input to the input unit is moved from one key to another, to inform that the input to the another key is accepted and a timing of updating display of a character assigned to the another key in a second mode, which is different from a first mode when informing that the input to the one key is accepted and a timing of updating display of a character assigned to the one key.

Effect of the Invention

The present invention enables a user to input characters without watching a mobile terminal.

DESCRIPTION OF THE NUMBERS

Figure 1:
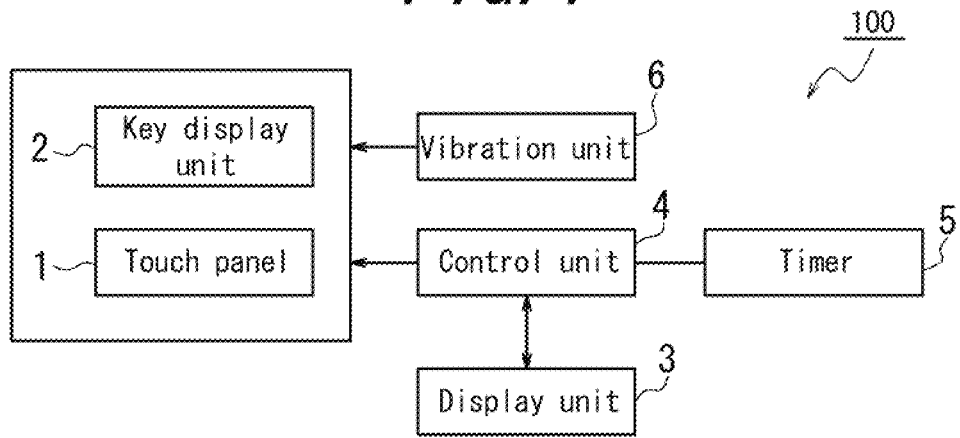
FIG. 1 is a block diagram showing an example of a mobile terminal in accordance with a first embodiment of the present invention.

1. Touch panel
2. Key display unit
3. Display unit
4. Control unit
5. Timer
6. Vibration unit
7. Input character buffer
8. Predictive conversion candidate indication unit
9. Memory unit
100. Mobile terminal

DESCRIPTION OF THE PREFERRED EMBODIMENTS

Embodiments of a mobile terminal in accordance with the present invention will be described below with reference to the drawings. The mobile terminal in accordance with the present invention is applicable to a compact mobile apparatus such as a cell phone and a PDA (Personal Digital Assistant).

First Embodiment

FIG. 1 is a block diagram showing an example of a mobile terminal in accordance with a first embodiment of the present invention. In FIG. 1, the mobile terminal 100 has a touch panel 1, a key display unit 2, a display unit 3, a control unit 4, a timer 5 and a vibration unit 6.

Figure 2:
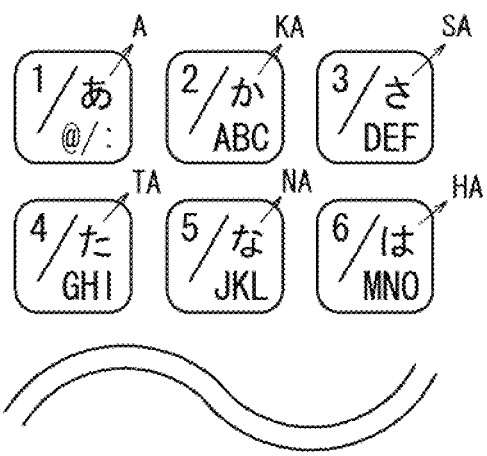
FIG. 2 is a diagram showing a numeric keypad displayed on a key display unit.

The touch panel 1 is arranged on the front face of the key display unit 2 and accepts inputs to a numeric keypad displayed on the key display unit 2. As shown in FIG. 2, not only the numbers from "0" to "9" but characters of "row A", "row KA", "row SA" . . . "@", "ABC", "DEF" and the like are also assigned to the numeric keypad displayed on the key display unit 2. In other words, the touch panel 1 and the key display unit 2 constitute an input unit. It should be noted that in the case where the key display unit 2 itself has a function as a touch panel that accepts inputs, an input unit may be configured only by the key display unit 2 without a touch panel separately.

The display unit 3 is configured by a liquid crystal screen or the like that displays the various information under control of the control unit 4. As an example, the display unit 3 displays an e-mail composition/edition screen when compositing an e-mail and displays a character corresponding to an input to the numeric keypad (actually it is an input to the corresponding region of the touch panel 1) displayed on the key display unit 2. The key display unit 2 and the display unit 3 may be configured as separate display devices or configured by separating a display region on the same display device.

The control unit 4 measures the time for which the key displayed on the key display unit 2 is kept pressed (long press time) with the timer 5 and regards the key as being pressed once each time a predetermined period passes while the key is kept pressed long, then displays characters assigned to the key on the display unit 3 by updating them one by one. Further, the control unit 4 notifies the vibration unit 6 of the timing of updating each character at each time a predetermined period passes while the key is kept pressed long. In other words, the control unit 4 and the timer 5 constitute a long press determination unit.

The vibration unit 6 vibrates the touch panel 1 based on the timing of updating a character that is notified from the control unit 4. The vibration unit 6 is configured by an oscillator such as a piezoelectric actuator and a vibrator such as a compact motor or the like. In other words, the vibration unit 6 constitutes an informing unit.

Figure 3:
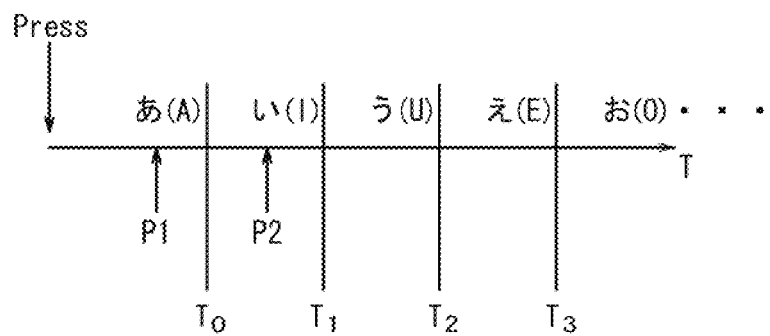
FIG. 3 is a diagram illustrating timings of updating a plurality of characters assigned to a key while a key is kept pressed long.

FIG. 3 is a diagram illustrating the timings to update a plurality of characters assigned to a key (characters displayed are switched one by one) while the key displayed on the key display unit 2 is kept pressed long (actually while the corresponding region on the touch panel 1 is kept pressed long). In FIG. 3, T indicates a long press time and $T_x$ (x=0, 1, 2, . . . ) indicates the time at which a character is switched.

For example, when the user presses the key of "1/row A", the display unit 3 displays "A". Then when the user keeps pressing the key of "1/row A" long and the time $T_0$ has passed, "A" displayed on the display unit 3 is updated to "I", and when the time of $T_1$ has passed while the key of "1/row A" is kept pressed long, "I" displayed on the display unit 3 is updated to "U". In the same manner, when the time $T_2$ has passed while the key of "1/row A" is kept pressed long, the character is updated from "U" to "E", and then when the time $T_3$ has passed, the character is updated from "E" to "O".

The time $T_x$ (x=0, 1, 2 . . . ), which is the timing of updating a character, is stored in a storage unit such as a memory (not shown) and the like and such timing may be set specific to each terminal or may be set by the user as desired. In addition, given that $T_x=T_{x-1}+\Delta T$ (x=0, 1, 2 . . . ), settings to be made are only $T_0$ (the first update timing) and $\Delta T$ (interval between each update timing), and it is convenient.

Figure 4:
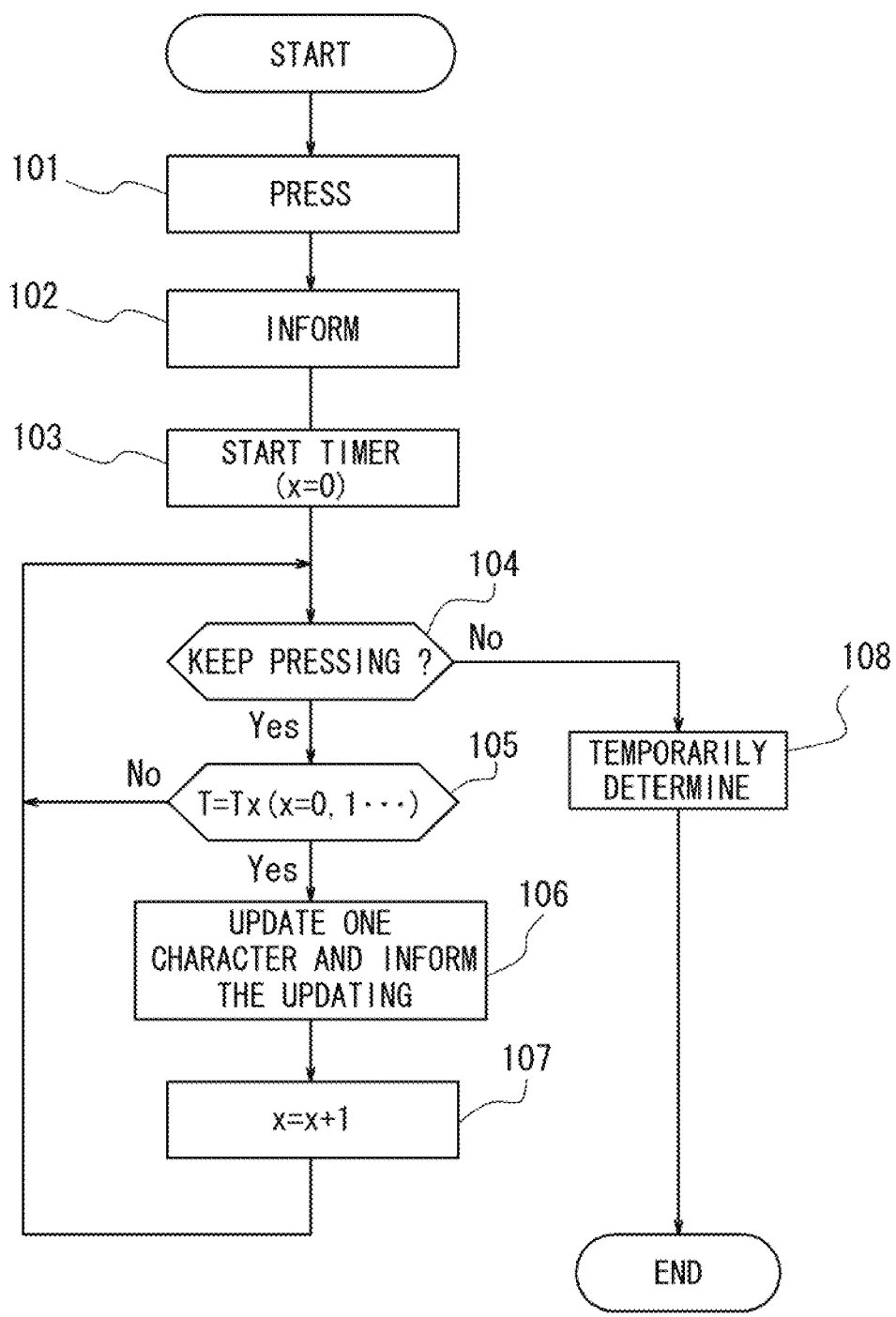
FIG. 4 is a flowchart illustrating operation of the mobile terminal in accordance with the first embodiment.

FIG. 4 is a flowchart illustrating operation of the mobile terminal in accordance with the first embodiment. First, when a key displayed on the key display unit 2, for example, the key of "1/row A" is pressed (step S101), the control unit 4 displays "A" on the display unit 3 and vibrates the vibration unit 6 to inform a user that the press to the key of "1/row A" has been accepted (step S102), and then controls the timer 5 to start measuring the time T for which the key of "1/row A" is kept pressed (step S103). The control unit 4 initializes the counter value x at step S103.

When the time T for which the key of "1/row A" is kept pressed (long press time) reaches $T_0$ (steps S104 and S105), the control unit 4 updates "A" displayed on the display unit 3 to "I" and vibrates the touch panel 1 through the vibration unit 6 (step S106), and then increments the counter value x (step S107).

Steps from S104 to S107 are repeated while the key of "1/row A" is kept pressed. Then when the key of "1/row A" is released (No at step S104), the control unit 4 temporarily determines (step S108) the character displayed on the display unit 3 at the time when the key is released. The temporal determination means that the display of the character is not updated to another even if any key is pressed in a state where the character assigned to the key is displayed, and a new character is displayed next to the character that is being displayed.

For example, when the long press time T is less than $T_0$, that is, when the key of "1/row A" is released at the timing of P1 in FIG. 3, "A" is temporarily determined. In the same manner, when it satisfies $T_0 \leq T < T_1$ where the T is the long press time, that is, the key of "1/row A" is released at the timing of P2 in FIG. 3, "I" is temporarily determined.

As described above, in the first embodiment, characters assigned to a key are displayed in order according to the long press time of the key and the timings of updating the display of the character are informed to the user through vibration. Therefore the user can count the number of times of updating the characters and determine the target character assigned to the key based on the number of times of updating that have been counted. Thus the user can input the target character without watching the mobile terminal.

Second Embodiment

The present embodiment shows an embodiment in which the first embodiment is applied to English text typing. An example of a mobile terminal in accordance with the second embodiment is shown in FIG. 1 as in the case of the first embodiment. The explanation of the first embodiment is used for the explanation of the configuration shown in FIG. 1.

Figure 10:
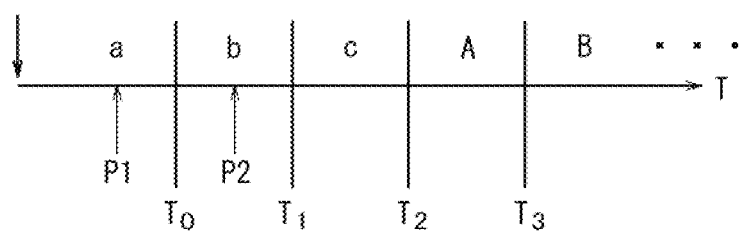
FIG. 10 is a diagram illustrating timings of updating a plurality of characters (alphabets) assigned to the key while the key is kept pressed long.

FIG. 10 is a diagram illustrating the timings to update a plurality of characters assigned to a key (characters displayed are switched one by one) while the key displayed on the key display unit 2 is kept pressed long (actually while the corresponding region on the touch panel 1 is kept pressed long). In FIG. 10, T indicates a long press time and $T_x$ (x=0, 1, 2, . . . ) indicates the time at which a character is switched.

For example, when the user presses the key of "2/ABC", the display unit 3 displays the "a". Then when the user keeps pressing the key of "2/ABC" long and the time $T_0$ has passed, "a" displayed on the display unit 3 is updated to "b", and when the time of $T_1$ has passed while the key of "2/ABC" is kept pressed long, "b" displayed on the display unit 3 is updated to "c". In the same manner, when the time of $T_2$ has passed while the key of "2/ABC" is kept pressed long, the character is updated from "c" to "A", then when the time $T_3$ has passed, the character is updated from "A" to "B".

The time $T_x$ (x=0, 1, 2 . . . ), which is the timing of updating a character, is stored in a storage unit such as a memory (not shown) and the like and such timing may be set specific to each terminal or may be set by the user as desired. In addition, given that $T_x=T_{x-1}+\Delta T$ (x=0, 1, 2 . . . ), settings to be made are only $T_0$ (the first update timing) and $\Delta T$ (the interval between each update timing), and it is convenient.

Operation of the mobile terminal in accordance with the second embodiment is described with reference to the flowchart in FIG. 4. First, when a key displayed on the key display unit 2, for example, the key of "2/ABC" is pressed (step S101), the control unit 4 displays "a" on the display unit 3 and vibrates the vibration unit 6 to inform the user that the press to the key of "2/ABC" has been accepted (step S102), and then controls the timer 5 to start measuring the time T for which the key of "2/ABC" is kept pressed (step S103). The control unit 4 initializes the counter value x at step S103.

When the time T for which the key of "2/ABC" is kept pressed (long press time) reaches $T_0$ (steps S104 and S105), the control unit 4 updates "a" displayed on the display unit 3 to "b" and vibrates the touch panel 1 through the vibration unit 6 (step S106), and then increments the counter value x (step S107).

Steps from S104 to S107 are repeated while the key of "2/ABC" is kept pressed. Then when the key of "2/ABC" is released (No at step S104), the control unit 4 temporarily determines (step S108) the character displayed on the display unit 3 at the time when the key is released. The temporal determination means that the display of the character is not updated to another even if any key is pressed in a state where the character assigned to the key is displayed, and a new character is displayed next to the character that is being displayed.

For example, when the long press time T is less than $T_0$, that is, when the key of "2/ABC" is released at the timing of P1 in FIG. 10, "a" is temporarily determined. In the same manner, when it satisfies $T_0 \leq T < T_1$ where the T is the long press time, that is, the key of "2/ABC" is released at the timing of P2 in FIG. 10, "b" is temporarily determined.

As described above, in the second embodiment, characters assigned to the key are displayed in order according to the long press time of the key and the timings of updating the display of the character are informed to the user through vibration. Therefore the user can count the number of times of updating the characters and determine the target character assigned to the key based on the number of the times of updating that have been counted. Thus the user can input the target character without watching the mobile terminal.

Third Embodiment

Figure 5:
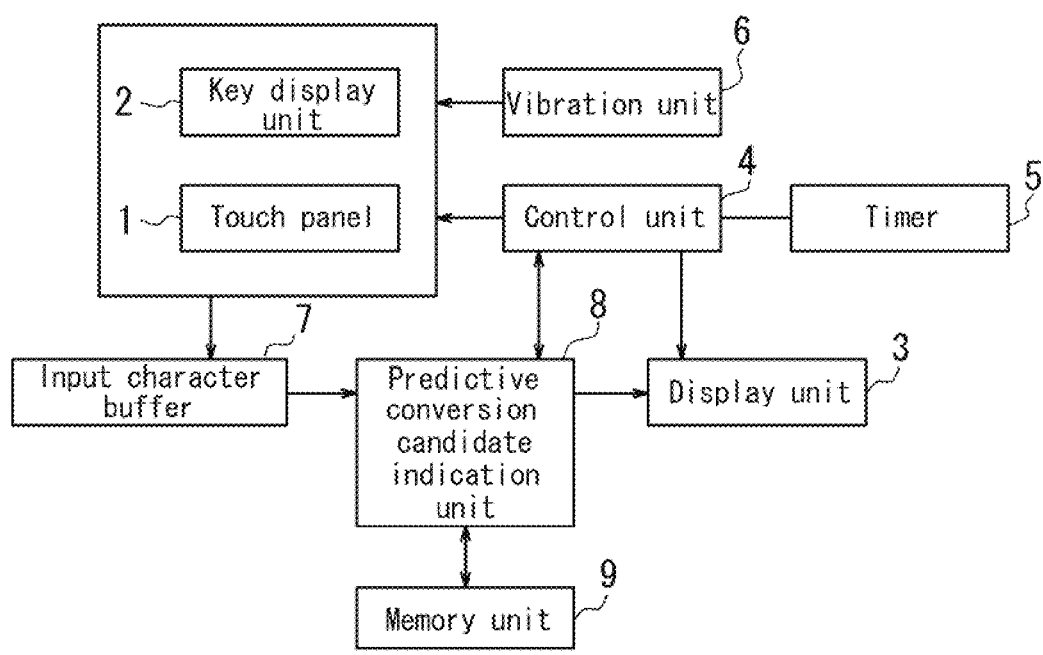
FIG. 5 is a block diagram showing an example of a mobile terminal in accordance with a third embodiment of the present invention.

Next, a third embodiment of the present invention is described. FIG. 5 is a block diagram showing an example of a mobile terminal in accordance with the third embodiment of the present invention. This mobile terminal has a configuration in which an input character buffer 7, a predictive conversion candidate indication unit (conversion candidate indication unit) 8 and a memory unit 9 are added to the mobile terminal shown in FIG. 1. Therefore, explanations about the elements in FIG. 5 having the same numerals as in FIG. 1 are omitted.

The input character buffer 7 stores temporarily-determined characters. The predictive conversion candidate indication unit 8 determines whether or not a conversion candidate character string corresponding to the input character string stored in the input character buffer 7 is stored (exists) in the memory unit 9 and if a conversion candidate character string exists, selectably displays the conversion candidate character string on the display unit 3. The conversion candidate character string means conversion of the character string stored in the input character buffer 7 into a character string including Chinese character(s) or into a character string including several predicted characters (e.g. Chinese character included expression of "KAERI", strings including several predicted characters such as "KAERIMICHI", "KAERIMI", "KAERIZAKI" and the like). Therefore, in the present embodiment, a character string of "KAERI" expressed in HIRAGANA, which is the same character stored in the input character buffer 7, and a character string of "KAERI" expressed in KATAKANA, obtained by simply converting the input character string into KATAKANA, are not considered as the conversion candidate character string.

Figure 6:
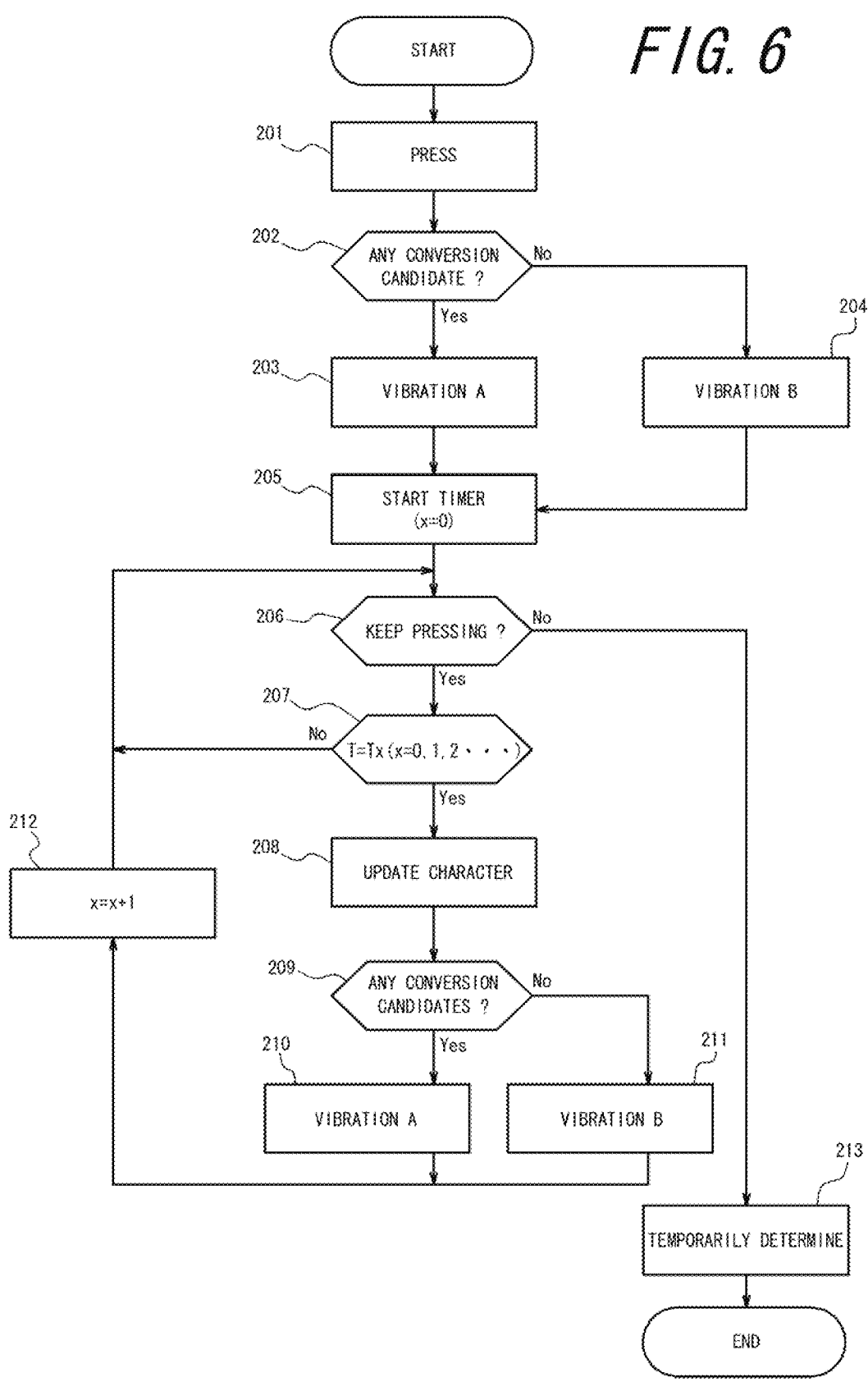
FIG. 6 is a flowchart illustrating operation of the mobile terminal in accordance with the third embodiment.

FIG. 6 is a flowchart illustrating operation of the mobile terminal in accordance with the third embodiment. First, when a key displayed on the key display unit 2 is pressed (step S201), the control unit 4 stores a character corresponding to the press in the "n"th of the input character buffer 7. The predictive conversion candidate indication unit 8 refers to the input character buffer 7 and determines whether or not the conversion candidate character string corresponding to the character string consisted of n pieces of characters stored in the input character buffer 7 is stored in the memory unit 9 (step S202). When the conversion candidate character string corresponding to the character string stored in the input character buffer 7 is stored in the memory unit 9, the predictive conversion candidate indication unit 8 notifies the control unit 4 accordingly and selectably displays the conversion candidate character string on the display unit 3. The control unit 4 displays the first character assigned to the key that is pressed on the display unit 3 and when receiving a notification indicating that there is a conversion candidate character string corresponding to the character string stored in the input character buffer 7 from the predictive conversion candidate indication unit 8, applies strong vibration (vibration A) to the touch panel 1 through the vibration unit 6 to inform the user that the press (input) to the key has been accepted (step S203). On the other hand, when receiving a notification indicating that there is no conversion candidate character string corresponding to the character string stored in the input character buffer 7, the control unit 4 applies weak vibration (vibration B) to the touch panel 1 through the vibration unit 6 to inform the user that the press (input) to the key has been accepted (step S204). Further, the control unit 4 initializes the counter value x, and controls the timer 5 to start measuring the time T for which the key is kept pressed (step S205).

When the time T for which the key is kept pressed (long press time) reaches $T_0$ (steps S206 and S207), the control unit 4 updates the character stored in the "n"th of the input character buffer 7 to a character that is next assigned to the key and updates the character displayed on the display unit 3 correspondingly to the update of the input character buffer 7 (step S208).

The predictive conversion candidate indication unit 8 refers to the input character buffer 7 and determines whether or not the conversion candidate character string corresponding to the character string stored in the input character buffer 7 is stored in the memory unit 9 (step S209). When the conversion candidate character string corresponding to the character string stored in the input character buffer 7 is stored in the memory unit 9, the predictive conversion candidate indication unit 8 notifies the control unit 4 accordingly and selectably displays the conversion candidate character string on the display unit 3. The control unit 4 updates the character displayed on the display unit 3 corresponding to the character updated by the input character buffer 7 (step S208) and when receiving a notification indicating that there is the conversion candidate character string corresponding to the character string stored in the input character buffer 7 from the predictive conversion candidate indication unit 8, applies strong vibration (vibration A) to the touch panel 1 through the vibration unit 6 to inform the user that the character has been updated and there is the conversion candidate character string corresponding to the character string including the updated character (step S210). On the other hand, when receiving a notification indicating that there is no conversion candidate character string corresponding to the character string stored in the input character buffer 7, the control unit 4 applies weak vibration (vibration B) to the touch panel 1 through the vibration unit 6 to inform the user that the character has been updated but there is no conversion candidate character string corresponding to the character string including the updated character (step S211). Further, the counter value x is incremented by the control unit 4 (step S212).

Steps from S206 to S212 are repeated while a key on the key display unit 2 is kept pressed, and when the key is released (No at step S206), the control unit 4 temporarily determines the character stored in the input character buffer 7 at the time when the key is released, that is, the character displayed on the display unit 3 at the time when the key is released (step S213).

Figure 7:
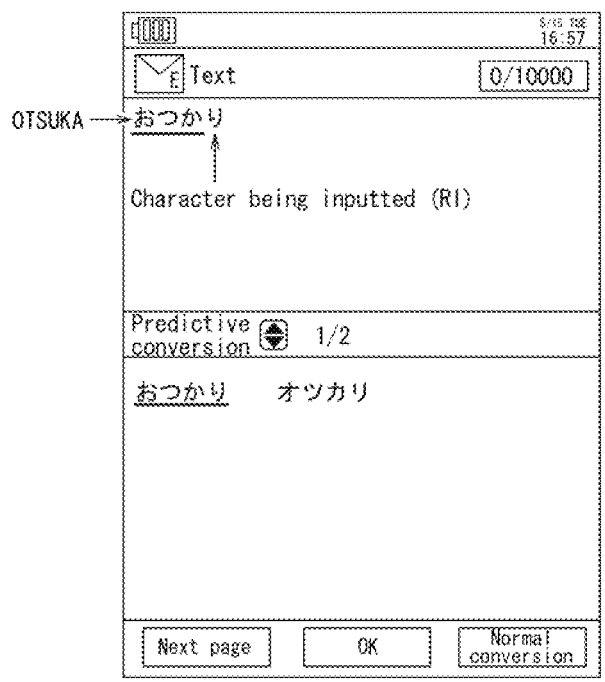
FIG. 7 is a diagram showing an example of a display screen when there is no conversion candidate character string except for an input character string.
Figure 8:
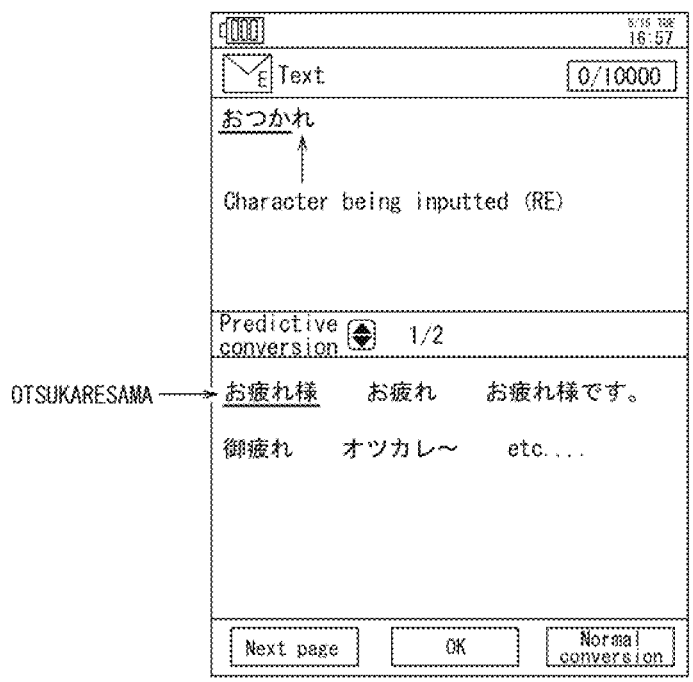
FIG. 8 is a diagram showing an example of the display screen when there is conversion candidate character strings.

Here, FIG. 7 shows an example of the display screen in the case where there is no character string (conversion candidate character string) that can be a conversion candidate to the input character string stored in the input character buffer 7 except for the input character string, and FIG. 8 shows an example of the display screen in the case where there are conversion candidate character strings. With reference to FIG. 7 and FIG. 8, in order to illustrate operation of the mobile terminal in accordance with the third embodiment more specifically, the present embodiment is described with reference to the above flowchart by taking an example of the scene where the user has inputted "OTSUKA" and now is inputting the 4th character of "RE" when he/she desires to input "OTSUKARESAMADESHITA".

First, when the user presses the key of "9/row RA" displayed on the key display unit 2 (step S201) to input the character of "RE" in the state where the three characters of "OTSUKA" are displayed on the display unit 3 as a temporarily determined character string, the control unit 4 stores the character of "RA" in the input character buffer 7 in response to the press. Since there have already been stored three characters of "O", "TSU" and "KA" in the input character buffer 7, "RA" is stored in the 4th of the input character buffer 7.

The predictive conversion candidate indication unit 8 refers to the input character buffer 7 to determine whether or not the conversion candidate character string corresponding to "OTSUKARA" currently stored is stored in the memory unit 9 (step S202) and since the conversion candidate character string corresponding to "OTSUKARA" is not stored (does not exist) in the memory unit 9, notifies the control unit 4 accordingly. The control unit 4, in response to the press of the key of "9/row RA", displays "RA" stored in the input character buffer 7 next to the "OTSUKA" that has already been displayed on the display unit 3. And, in response to the notification indicating that there is no conversion candidate character string corresponding to "OTSUKARA" from the predictive conversion candidate indication unit 8, the control unit 4 informs the user that the press (input) to the key of "9/row RA" has been accepted (step S204) by applying weak vibration to the touch panel 1 through the vibration unit 6. Further, the control unit 4 controls the timer 5 to start measuring the time T for which the key of "9/row RA" is kept pressed (step S205). At this time the control unit 4 initializes the counter number x.

Figure 9:
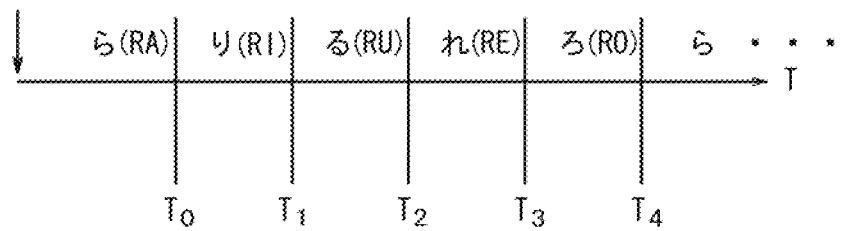
FIG. 9 is a diagram illustrating timings of updating characters of "row RA" while the key of "9/row RA" is kept pressed long.

Here, the timings to update the characters of "row RA" while the key of "9/row RA" is kept pressed long is shown in FIG. 9.

When the time T for which the key of "9/row RA" is kept pressed (long press time) reaches $T_0$ (steps S206 and S207), the control unit 4 updates the character of "RA" stored in the 4th of the input character buffer 7 to "RI" and updates "OTSUKARA" displayed on the display unit 3 to "OTSUKARI" (step S208).

The predictive conversion candidate indication unit 8 refers to the input character buffer 7 to determine whether or not the conversion candidate character string corresponding to "OTSUKARI" is stored in the memory unit 9 (step S209) and then notifies the control unit 4 that the conversion candidate character string corresponding to the character string of "OTSUKARI" stored in the input character buffer 7 is not stored in the memory unit 9. Then, the control unit 4 updates "RA" displayed on the display unit 3 to "RI" (step S208), and in response to the notification indicating that there is no conversion candidate character string corresponding to the character string of "OTSUKARI" from the predictive conversion candidate indication unit 8, applies weak vibration to the touch panel 1 through the vibration unit 6 (step S211). Thereafter the counter value x is incremented by the control unit 4 (step S212). FIG. 7 shows what is displayed on the display unit 3 at this time.

Steps from S206 to S212 are repeated while the key of "9/row RA" is kept pressed. Then when the long press time T reaches $T_2$ (steps S206 and S207), the control unit 4 updates the character of "RU" stored in the 4th of the input character buffer 7 to "RE" and updates "OTSUKARU" displayed on the display unit 3 to "OTSUKARE" (step S208).

The predictive conversion candidate indication unit 8 refers to the input character buffer 7 to determine whether or not the conversion candidate character string corresponding to "OTSUKARE" is stored in the memory unit 9 (step S209) and notifies the control unit 4 that the conversion candidate character string corresponding to the character string of "OTSUKARE" stored in the input character buffer 7 is stored in the memory unit 9. The control unit 4 updates "RU" displayed on the display unit 3 to "RE" (step S208) and when receiving a notification indicating that there is the conversion candidate character string corresponding to the character string of "OTSUKARE" from the predictive conversion candidate indication unit 8, applies strong vibration (step S210) to the touch panel 1 through the vibration unit 6. Thereafter the counter value x is incremented by the control unit 4 (step S212). FIG. 8 shows what is displayed on the display unit 3 at this time.

As shown in FIG. 8, when the key of "9/row RA" is released (No at step S206) while "OTSUKARE" is displayed on the display unit 3, that is, at the timing of $T_2 \leq T < T_3$ where the T is the time for which the key is kept pressed, the control unit 4 temporarily determines the character "RE" stored in the 4th of the input character buffer 7 at this point of time as an input character (step S213). Further, when one candidate is selected from among the conversion candidate character strings corresponding to "OTSUKARE" temporarily determined, the selected candidate is determined as input characters.

As described above, in the third embodiment, when a timing of updating the display of the character assigned to the key is informed to the user through vibration correspondingly to the time for which the key is kept pressed, vibration strength is changed depending on the existence of the conversion candidate character string corresponding to the character string that is displayed. Thus the user can determine the character currently displayed based on the number of vibrations and determine whether the conversion candidate character string exists, that is, a comprehensible word is displayed, based on the strength of vibration. Therefore, the user can determine whether the target character is displayed (inputted) more correctly and input characters more easily without watching the mobile terminal.

Fourth Embodiment

The present embodiment shows an embodiment in which the third embodiment is applied to English text typing. An example of a mobile terminal in accordance with a fourth embodiment is shown in FIG. 5 as in the case of the third embodiment. The explanation of the third embodiment is used for the explanation of the configuration shown in FIG. 5.

Figure 11:
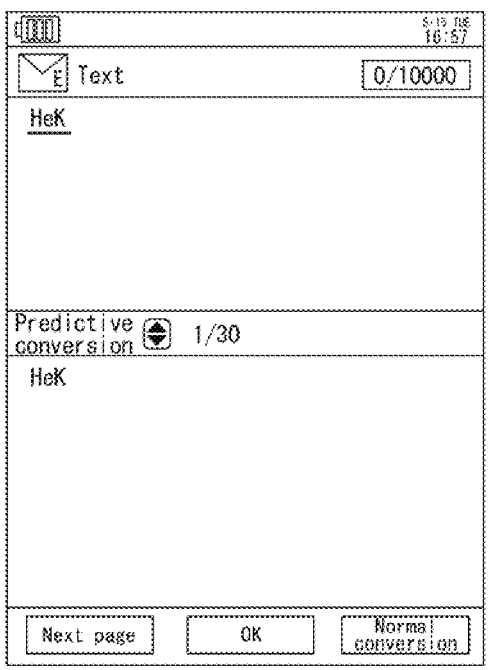
FIG. 11 is a diagram showing an example of a display screen (English) when there is no conversion candidate character string except for an input character string.
Figure 12:
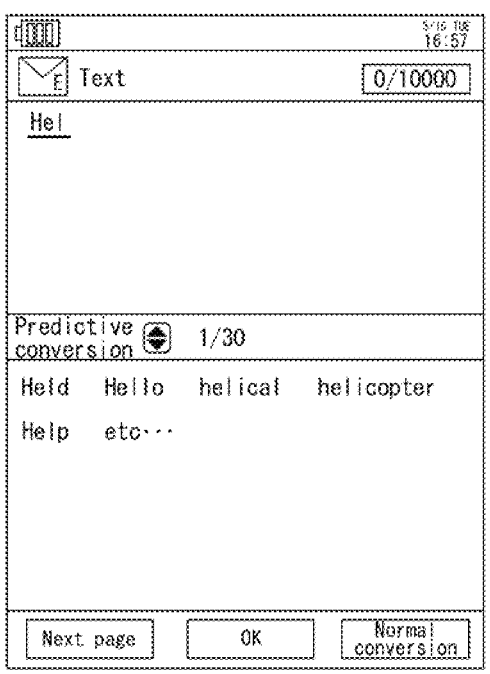
FIG. 12 is a diagram showing an example of the display screen (English) when there is conversion candidate character strings.

FIG. 11 shows an example of the display screen in the case where there is no character string (conversion candidate character string) that can be a conversion candidate to the input character string stored in the input character buffer 7 except for the input character string, and FIG. 12 shows an example of the display screen in the case where there are conversion candidate character strings. With reference to FIG. 11 and FIG. 12, in order to illustrate operation of the mobile terminal in accordance with the forth embodiment more specifically, the present embodiment is described based on the flowchart shown in FIG. 6 by taking an example of the scene where the user has inputted "He" and now is inputting the 3rd character of "l" when he/she desires to input "Hello".

First, when the user presses the key of "5/JKL" displayed on the key display unit 2 (step S201) to input the character of "l" in the state where the two characters of "He" are displayed on the display unit 3 as a temporarily determined character string, the control unit 4 stores the character of "j" in the input character buffer 7 in response to the press. It should be noted that since there have already been stored two characters of "H" and "e" in the input character buffer 7, "j" is stored in the 3rd of the input character buffer 7.

The predictive conversion candidate indication unit 8 refers to the input character buffer 7 to determine whether or not the conversion candidate character string corresponding to "Hej" currently stored is stored in the memory unit 9 (step S202) and since the conversion candidate character string corresponding to "Hej" is not stored (does not exist) in the memory unit 9, notifies the control unit 4 accordingly. The control unit 4, in response to the press of the key of "5/JKL", displays "j" stored in the input character buffer 7 next to the "He" that has been already displayed on the display unit 3 and, in response to the notification indicating that there is no conversion candidate character string corresponding to "Hej" from the predictive conversion candidate indication unit 8, informs the user that the press (input) to the key of "5/JKL" has been accepted (step S204) by applying weak vibration to the touch panel 1 through the vibration unit 6. Further, the control unit 4 controls the timer 5 to start measuring the time T for which the key of "5/JKL" is kept pressed (step S205). At this time the control unit 4 initializes the counter value x.

Figure 13:
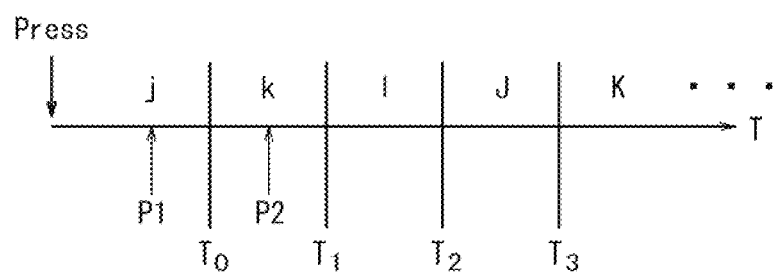
FIG. 13 is a diagram illustrating timings of updating characters of "JKL" while "5/JKL" is kept pressed long.

Here, the timings to update the characters of "jklJKL" while the key of "5/JKL" is kept pressed long is shown in FIG. 13.

When the time T for which the key of "5/JKL" is kept pressed (long press time) reaches $T_0$ (steps S206 and S207), the control unit 4 updates the character of "j" stored in the 3rd of the input character buffer 7 to "k" and updates "Hej" displayed on the display unit 3 to "Hek" (step S208).

The predictive conversion candidate indication unit 8 refers to the input character buffer 7 to determine whether or not the conversion candidate character string corresponding to "Hek" is stored in the memory unit 9 (step S209) and notifies the control unit 4 that the conversion candidate character string corresponding to the character string of "Hek" stored in the input character buffer 7 is not stored in the memory unit 9. The control unit 4 updates "j" displayed on the display unit 3 to "k" (step S208), and in response to the notification indicating that there is no conversion candidate character string corresponding to the character string of "Hek" from the predictive conversion candidate indication unit 8, applies weak vibration (step S211) to the touch panel 1 through the vibration unit 6. Thereafter the counter value x is incremented by the control unit 4 (step S212). FIG. 11 shows what is displayed on the display unit 3 at this time.

Steps from S206 to S212 are repeated while the key of "5/JKL" is kept pressed. Then when the long press time T reaches $T_1$ (steps S206 and S207), the control unit 4 updates the character of "k" stored in the 3rd of the character input buffer 7 to "l" and updates "Hek" displayed on the display unit 3 to "Hel" (step S208).

The predictive conversion candidate indication unit 8 refers to the input character buffer 7 to determine whether or not the conversion candidate character string corresponding to "Hel" is stored in the memory unit 9 (step S209) and notifies the control unit 4 that the conversion candidate character string corresponding to the character string of "Hel" stored in the input character buffer 7 is stored in the memory unit 9. The control unit 4 updates "k" displayed on the display unit 3 to "l" (step S208) and when receiving a notification indicating that there is the conversion candidate character string corresponding to the character string of "Hel" from the predictive conversion candidate indication unit 8, applies strong vibration (step S210) to the touch panel 1 through the vibration unit 6. Thereafter the counter value x is incremented by the control unit 4 (step S212). FIG. 12 shows what is displayed on the display unit 3 at this time.

As shown in FIG. 12, when the key of "5/JKL" is released while the "Hel" is displayed on the display unit 3, that is, at the timing of $T_1 \le T < T_2$ where the T is the time for which the key is kept pressed, the control unit 4 temporarily determines the character of "l" stored in the 3rd of the input character buffer 7 at this point of time as an input character (step S213). Further, when one candidate is selected from among the conversion candidate character strings corresponding to "Hel" temporarily determined, the selected candidate is determined as input characters.

As described above, in the forth embodiment, when a timing of updating the display of the character assigned to the key is informed to the user through vibration correspondingly to the time for which the key is kept pressed, vibration strength is changed depending on the existence of the conversion candidate character string corresponding to the character string displayed. Thus the user can determine the character currently displayed based on the number of vibrations and determine whether there is the conversion candidate character string, that is, a comprehensible word is displayed based on the strength of vibration. Therefore, the user can determine whether the target character is displayed (inputted) more correctly and input characters more easily without watching the mobile terminal.

Fifth Embodiment

Figure 14:
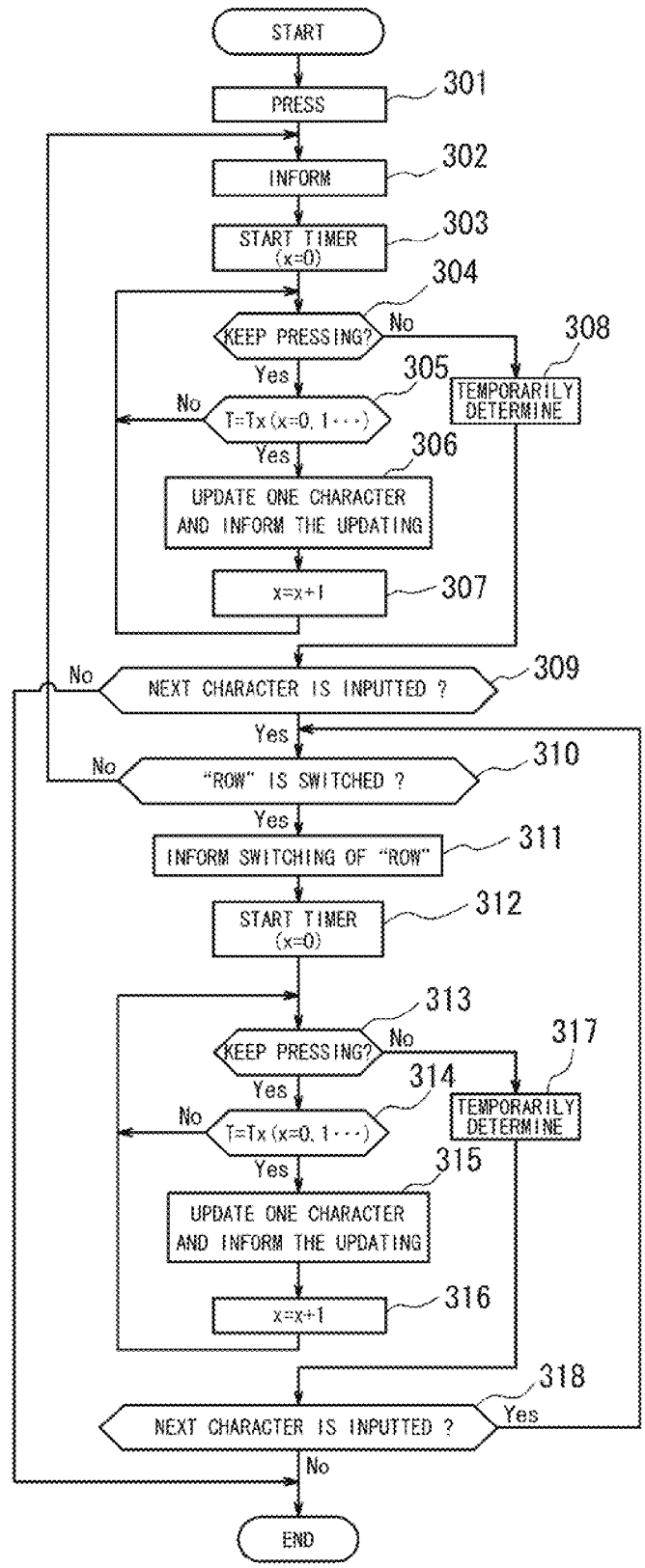
FIG. 14 is a flowchart illustrating operation of a mobile terminal in accordance with a fifth embodiment.

Next, a fifth embodiment of the present invention is described. FIG. 14 is a flowchart showing operation of a mobile terminal in accordance with the fifth embodiment of the present invention.

First, when a key displayed on the key display unit 2, for example the key of "1/row A" is pressed (step S301), the control unit 4 displays "A" on the display unit 3 and informs the user that the press to the key of "1/row A" has been accepted (step S302) by vibrating the vibration unit 6, then controls the timer 5 to start measuring the time T for which the key of "1/row A" is kept pressed (step S303). The control unit 4 initializes the counter value x at step S303.

When the time T for which the key of "1/row A" is kept pressed reaches $T_0$ (steps S304 and S305), the control unit 4 updates "A" displayed on the display unit 3 to "I" and vibrates the touch panel 1 (step S306) through the vibration unit 6, then the counter value x is incremented (step S307).

Steps from S304 to S307 are repeated while the key of "1/row A" is kept pressed and when the key of "1/row A" is released (No at step S304), the control unit 4 temporarily determines the character displayed on the display unit 3 at the time when the key is released (step S308).

When the character is temporarily determined, the control unit 4 monitors whether or not the next key is inputted, that is, the next key is pressed (step S309), and when the next key is pressed, determines whether or not the row corresponding to the key input has been switched from the row corresponding to the key input that has been performed right before (step S310).

For example, in the case where the key of "1/row A" has been pressed right before and the key of "1/row A" is pressed again after temporal determination of the character, switching of the row corresponding to the key input has not occurred. In this case, the process flow of the mobile terminal goes back to step S302 and the control unit 4 displays "A" on the display unit 3 and informs the user that the press to the key of "1/row A" has been accepted by vibrating the vibration unit 6.

On the other hand, for example, in the case where the key of "1/row A" has been pressed right before and the key of "2/row KA" is pressed after temporal determination of the character, switching of the row corresponding to the key input occurs. In this case, the control unit 4 displays "KA" on the display unit 3 and informs the user that the switching to the row corresponding to the key of "2/row KA" has occurred (step S311) by vibrating the vibration unit 6 in an informing mode which is different from when informing the user that the press to the key has been accepted at step S302. Thus the user can recognize the switching of the row without watching the screen. Since the process of the steps from S312 to S318 is the same as that of the steps from S303 to S309, explanation thereof is omitted.

As described above, in the fifth embodiment, in the case where the key to input a character is switched from a key for a certain row to a key for another row, occurrence of such switching of row is informed to the user. Thus the user can recognize the switching of row without watching the mobile terminal and input desired characters more correctly.

Sixth Embodiment

Next a sixth embodiment of the present invention is described. The present embodiment shows an embodiment in which the fifth embodiment is applied to English text typing. Operation of a mobile terminal in accordance with the sixth embodiment of the present invention is described with reference to a flowchart shown in FIG. 14. It should be noted that "switching of a row" described in steps S310 and S311 is interpreted as "switching of an input key" in the present embodiment.

First, when a key displayed on the key display unit 2, for example, the key of "2/ABC" is pressed (step S301), the control unit 4 displays "a" on the display unit 3 and informs the user that the press to the key of "2/ABC" has been accepted (step S302) by vibrating the vibration unit 6, and then controls the timer 5 to start measuring the time T for which the key of "2/ABC" is kept pressed (step S303). The control unit 4 initializes the counter value x at step S303.

When the time T for which the key of "2/ABC" is kept pressed reaches $T_0$ (steps S304 and S305), the control unit 4 updates "a" displayed on the display unit 3 to "b" and vibrates the touch panel 1 (step S306) through the vibration unit 6, then increments the counter value x (step S307).

Steps from S304 to S307 are repeated while the key of "2/ABC" is kept pressed and when the key of "2/ABC" is released (No at step S304), the control unit 4 temporarily determines the character displayed on the display unit 3 at the time when the key is released (step S308).

When the character is temporarily determined, the control unit 4 monitors whether or not there is the next key input, that is, the next character input key is pressed (step S309), and when there is the next key input, determines whether or not the input key corresponding to the input is switched from the key corresponding to the input performed right before (step S310).

For example, in the case where the key of "2/ABC" has been pressed right before and the key of "2/ABC" is pressed again after temporal determination of the character, switching of input key has not occurred. In this case, the process flow of the mobile terminal goes back to step S302 and the control unit 4 displays "a" on the display unit 3 and informs the user that the press to the key of "2/ABC" has been accepted by vibrating the vibration unit 6.

On the other hand, for example, in the case where the key of "2/ABC" has been pressed right before and the key of "5/JKL" is pressed after temporal determination of the character, switching of input key occurs. In this case, the control unit 4 displays "j" on the display unit 3 and informs the user that the switching to the key of "5/JKL" has occurred (step S311) by vibrating the vibration unit 6 in an informing mode which is different from when informing the user that the press to the key has been accepted at step S302. Thus the user can recognize the switching of input key without watching the screen. Since the process of the steps from S312 to S318 is the same as that of the steps from S303 to S309, explanation thereof is omitted.

As described above, in the sixth embodiment, in the case where a key to input a character is switched from one key to another, occurrence of such switching of input key is informed to the user. Thus the user can recognize the switching of input key without watching the mobile terminal and input desired characters more correctly.

Seventh Embodiment

Figure 15:
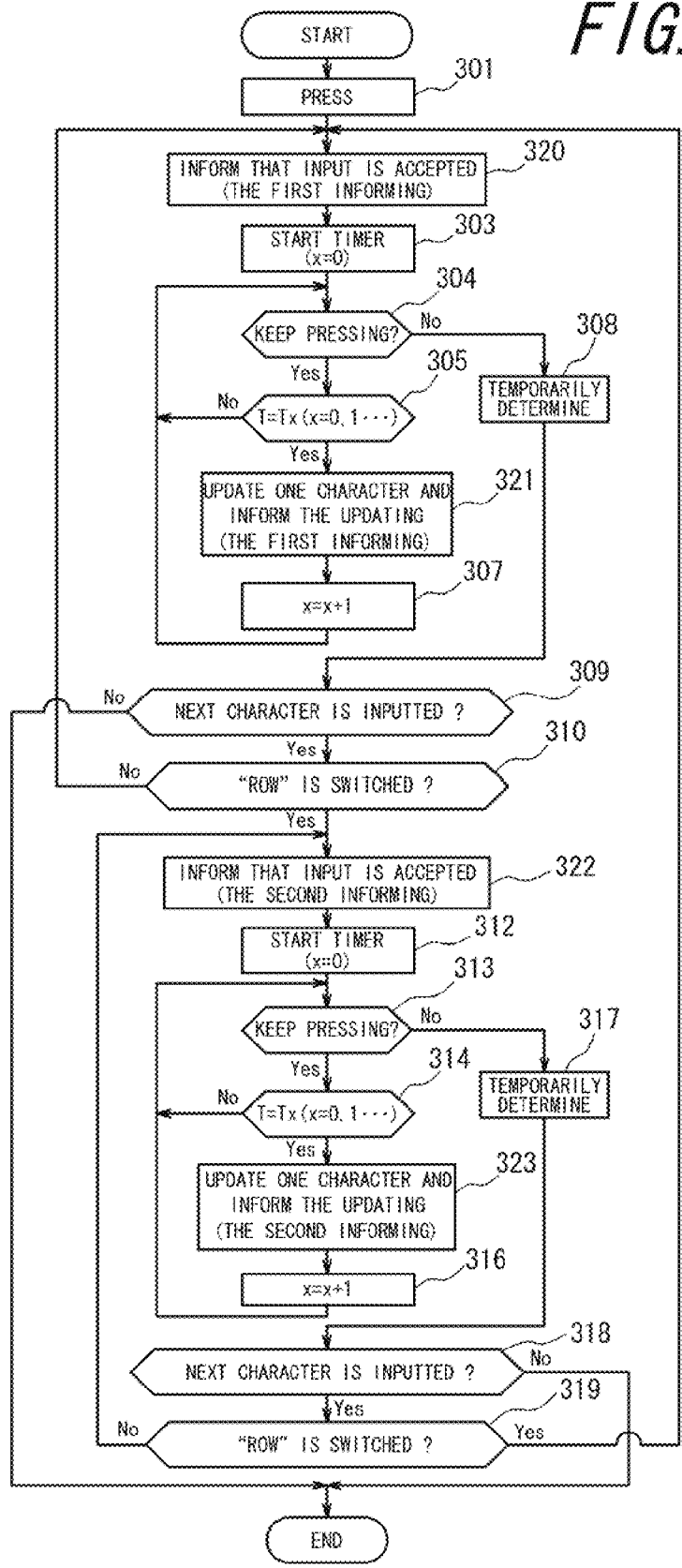
FIG. 15 is a flowchart illustrating operation of a mobile terminal in accordance with a seventh embodiment.

Next, a seventh embodiment of the present invention is described. FIG. 15 is a flowchart illustrating operation of a mobile terminal in accordance with the seventh embodiment of the present invention. With respect to this flowchart, a new step S319 is added to the flowchart shown in FIG. 14 and steps of S302, S306, S311 and S315 of FIG. 14 are replaced respectively by steps S320, S321, S322 and S323. In FIG. 15, the steps having the same numerals as those in FIG. 14 respectively indicate the same process. Therefore the explanation of the steps in FIG. 15 having the same numerals as those in FIG. 14 is omitted.

First, when a key displayed on the key display unit 2, for example the key of "1/row A" is pressed (step S301), the control unit 4 displays "A" on the display unit 3 and informs the user that the press to the key of "1/row A" has been accepted (step S320) by vibrating the vibration unit 6 in the first vibration mode. When the key is pressed long, the control unit 4 updates the character displayed on the display unit 3 and informs the user of the updating of the character displayed by vibrating the vibration unit 6 in the first vibration mode (step S321).

In the case where no switching of the row occurs when the next character is inputted (steps S309 and S310) after the character has temporarily been determined (step S308), the control unit 4 vibrates the vibration unit 6 in the first vibration mode to inform the user that the press to the key has been accepted (step S320).

In the case where switching of the row occurs when the next character is inputted (steps S309 and S310) after the character has temporarily been determined (step S308), the control unit 4 vibrates the vibration unit 6 in the second vibration mode which is different from the first vibration mode to inform the user that the press to the key has been accepted (step S322). Thus the user can recognize the switching of the row. When the key is pressed long, the control unit 4 updates the character displayed on the display unit 3 and vibrates the vibration unit 6 in the second vibration mode to inform the user of updating of the character displayed (step S323). In other words, in the case where the switching of the row occurs, it is possible to inform the user more clearly that the switching of the row has occurred by switching from the first vibration mode to the second vibration mode.

In the case where the character after next is inputted and no switching of the row occurs (steps S318 and S319), the control unit 4 vibrates the vibration unit 6 in the second vibration mode to inform the user that the press to the key has been accepted (step S322).

In the case where the character after next is inputted and switching of the row occurs (steps S318 and S319), the control unit 4 vibrates the vibration unit 6 in the first vibration mode to inform the user that the press to the key has been accepted (step S320). That is, in this case, it is possible to inform the user that switching of the row occurs again by switching the vibration mode to the character input acceptance and the character display update from the second vibration mode to the first vibration mode.

As described above, in the seventh embodiment, in the case where the key to input a character is switched from a key for a certain row to a key for another row, the informing mode to the character input acceptance and the character display update is changed before and after the switching of the row. Therefore the user can recognize the switching of the row without watching the mobile terminal and input the desired character more correctly.

Eighth Embodiment

Next, an eighth embodiment of the present invention is described. The present embodiment shows an embodiment in which the seventh embodiment is applied to English text typing. Operation of a mobile terminal in accordance with the eighth embodiment of the present invention is described with reference to a flowchart shown in FIG. 15. In FIG. 15, "switching of a row" described in steps S310 and S319 is interpreted as "switching of an input key" in the present embodiment.

First, when a key displayed on the key display unit 2, for example the key of "2/ABC" is pressed (step S301), the control unit 4 displays "a" on the display unit 3 and informs the user that the press to the key of "2/ABC" has been accepted (step S320) by vibrating the vibration unit 6 in the first vibration mode. When the key is pressed long, the control unit 4 updates the character displayed on the display unit 3 and informs the user of the updating of the character displayed by vibrating the vibration unit 6 in the first vibration mode (step S321).

In the case where no switching of the input key occurs when the next character is inputted (steps S309 and S310) after the character has temporarily been determined (step S308), the control unit 4 vibrates the vibration unit 6 in the first vibration mode to inform the user that the press to the key has been accepted (step S320).

In the case where switching of the input key occurs when the next character is inputted (steps S309 and S310) after the character has temporarily been determined (step S308), the control unit 4 vibrates the vibration unit 6 in the second vibration mode which is different from the first vibration mode to inform the user that the press to the key has been accepted (step S322). Thus the user can recognize the switching of the input key. When the key is pressed long, the control unit 4 updates the character displayed on the display unit 3 and vibrates the vibration unit 6 in the second vibration mode to inform the user of updating of the character displayed (step S323). In other words, in the case where the switching of the input key occurs, it is possible to inform the user more clearly that the switching of the input key has occurred by switching the vibration mode to the character input acceptance and the character display update from the first vibration mode to the second vibration mode.

In the case where the character after next is inputted and no switching of the input key occurs (steps S318 and S319), the control unit 4 vibrates the vibration unit 6 in the second vibration mode to inform the user that the press to the key has been accepted (step S322).

In the case where the character after next is inputted and switching of the input key occurs (steps S318 and S319), the control unit 4 vibrates the vibration unit 6 in the first vibration mode to inform the user that the press to the key has been accepted (step S320). That is, in this case, it is possible to inform the user that switching of the row occurs again by switching the vibration mode to the character input acceptance and character display update from the second vibration mode to the first vibration mode.

As described above, in the eighth embodiment, in the case where the key to input a character is switched from one key to another, the informing mode to the character input acceptance and the character display update is changed before and after the switching of the input key. Therefore the user can recognize switching of the input key without watching the mobile terminal and input the desired character more correctly.

Although each of the above embodiments is described by taking a mobile terminal provided with a touch panel as an input apparatus as an example, it should be noted that the present invention may be applicable to a mobile terminal provided with a hard key as an input apparatus.

In addition, besides the above described patterns, there may be various patterns of control of the vibration strength depending on the switching timing of character display, e.g., strong vibration for capital letters and weak vibration for small letters in the case where the characters to input are "alphabets", and gradually increasing vibration strength from "A" to "O" in the case of "HIRAGANA" characters.

Further, besides the vibration strength, it is possible to design the mobile terminal such that the existence of conversion candidate is informed by changing the vibration pattern, e.g., two quick vibrations when there is conversion candidate character string and one vibration when there is no conversion candidate character string.

Moreover, in the above embodiments, switching timing of the character display is informed through vibration. However, it is possible to inform by giving sound from a speaker or by using a buzzer provided to a mobile terminal or by changing the brightness of the light of the display unit. In this case, an informing unit is configured by a speaker and a buzzer, or a display unit provided to a mobile terminal.

The switching timing may be changed depending on the press state of the key. In other words, in the case where the user operates the touch panel with his/her finger, the area on the touch panel where the finger touches is detected. Then when the area is large (strong press), the intervals between the timings to switch character display may be made shorter and when the area is small (weak press), the intervals between the timings to switch character display may be made longer. Further, the pressure of the finger when it touches the touch panel may be detected. Then when the pressure is high (strong press), the intervals between the timings to switch character display may be made shorter and when the pressure is low (weak press), the intervals between the timings to switch character display may be made longer.

The present invention enables the user to count the number of updates of characters by displaying the characters assigned to the key in order depending on the long press time of the key and by informing the user of the timing of updating the display of the character. Therefore the user can determine the target character assigned to the key based on the number of updates of characters when input is performed by pressing the key long. Thus the user can input characters without watching the mobile terminal.

In addition, according to the present invention, when the timing of updating the character is informed, the informing method is changed depending on the existence of predictive conversion candidate to the character string inputted. Thus the user can input the desired character more correctly without watching the mobile terminal.

Moreover, according to the present invention, in the case where a key to input characters is switched from a key for a certain row to a key for another row, such occurrence of switching of the row is informed to the user. Therefore the user can recognize the switching of the row without watching the mobile terminal. Thus the user can input the desired character more correctly.

In addition, according to the present invention, in the case where a key to input characters is switched from a key for a certain row to a key for another row, the informing mode to the character input acceptance and the character display update is changed before and after the switching of the row. Therefore the user can recognize switching of the row without watching the mobile terminal and input the desired character more correctly.

The invention claimed is:

1. A mobile terminal comprising:
an input unit for accepting an input by a user;
a display unit for, while a key of the input unit is pressed long, displaying a plurality of characters assigned to the key in order by updating display every predetermined period of time;
an informing unit for informing that the input is accepted in response to the input to the input unit, and while the key of the input unit is pressed long, informing a timing of updating display of the character assigned to the key;
a memory unit for storing candidate character strings that can be conversion candidates of predictive conversion inputs;
a conversion candidate indication unit for indicating, among the candidate character strings stored in the memory unit, a conversion candidate character string corresponding to an input character string by the user; and
a control unit for determining, at a timing of switching display of a character by long press of a key, whether or not the input character string including a character after switching corresponds to one of the candidate character strings stored in the memory unit and for controlling an informing mode of the informing unit based on the determination result, wherein the informing mode comprises a first mode of informing the user that the input is accepted when the conversion candidate character string corresponding to the input character string is stored in the memory unit and a second mode of informing the user that the input is accepted when the conversion candidate character string corresponding to the input character string is not stored in the memory unit, wherein the first mode comprises a first vibrational pattern, and the second mode comprises a second vibrational pattern, wherein the first vibrational pattern comprises a higher number of vibrations compared to a corresponding number of vibrations of the second vibrational pattern.

2. The mobile terminal according to claim 1, further comprising a control unit for controlling the informing unit, when input to the input unit is moved from one key to another, to inform that the input to the another key is accepted differently than when informing that the input to the one key is accepted.

3. The mobile terminal according to claim 2, wherein the input unit comprises a key display unit for displaying a plurality of keys and a touch panel arranged in association with the key display unit.

4. The mobile terminal according to claim 2, wherein the informing unit informs that the input to the input unit is accepted by vibrating the input unit.

5. The mobile terminal according to claim 1, further comprising a control unit for controlling the informing unit, when input to the input unit is moved from one key to another, to inform that the input to the another key is accepted and a timing of updating display a character assigned to another key in a fourth mode, which is different from a third mode when informing that the input to the one key is accepted and a timing of updating display of a character assigned to the one key.

6. The mobile terminal according to claim 5, wherein the input unit comprises a key display unit for displaying a plurality of keys and a touch panel arranged in association with the key display unit.

7. The mobile terminal according to claim 5, wherein the informing unit informs that the input to the input unit is accepted by vibrating the input unit.

8. The mobile terminal according to claim 1, wherein the input unit comprises a key display unit for displaying a plurality of keys and a touch panel arranged in association with the key display unit.

9. The mobile terminal according to claim 1, wherein the informing unit informs that the input to the input unit is accepted and the update timing by vibrating the input unit.

10. The mobile terminal according to claim 9, wherein when the input to the input unit is accepted or at the update timing, the informing unit controls the informing mode by controlling strength of the vibration depending on whether or not a candidate character string corresponding to the input character string is stored in the memory unit.

11. The mobile terminal according to claim 1, wherein the input unit comprises a key display unit for displaying a plurality of keys and a touch panel arranged in association with the key display unit.

12. The mobile terminal according to claim 1, wherein the informing unit informs that the input to the input unit is accepted by vibrating the input unit.

* * * * *